(12) United States Patent
Lin

(10) Patent No.: US 6,881,977 B1
(45) Date of Patent: Apr. 19, 2005

(54) LIGHT EMITTING DEVICE BASED ON INDIRECT-BANDGAP MATERIALS

(76) Inventor: Ching-Fuh Lin, c/o Electrical Engineering of National Taiwan University, No. 1, Sec. 4, Roosevelt Rd., Taipei 106 (TW)

( * ) Notice: Subject to any disclaimer, the term of this patent is extended or adjusted under 35 U.S.C. 154(b) by 67 days.

(21) Appl. No.: 09/644,629

(22) Filed: Aug. 23, 2000

(30) Foreign Application Priority Data

Feb. 18, 2000 (TW) ........................................ 89102788 A

(51) Int. Cl.[7] .............................................. H01L 27/15

(52) U.S. Cl. .............................. 257/79; 257/82; 257/86; 257/93; 257/103

(58) Field of Search ............................ 257/81, 84, 88, 257/92, 93, 98, 99, 100, 690, 680, 700

(56) References Cited

U.S. PATENT DOCUMENTS

| | | | | |
|---|---|---|---|---|
| 5,475,698 A | * | 12/1995 | Cho | 372/7 |
| 5,625,729 A | * | 4/1997 | Brown | 385/31 |
| 5,705,047 A | * | 1/1998 | Lee | 205/123 |
| 6,157,047 A | * | 12/2000 | Fujita et al. | 257/51 |

OTHER PUBLICATIONS

Wang, Hai–Dan, Lu, Yong–Feng, Mai, Zhi–Hong and Ren, Zhong–Min, "Nano–scale Morphology and Crystallography of Laser–Deposited TiN Thin Films," Jpn. J. Appl. Phys. vol. 39, pp. 6268–6271, (Nov. 11, 2000).

Zhu, X. D., "Fabrication of nano–structural arrays by channeling pulsed atomic beams through pulsed–laser standing–waves under off–resonant condition," Applied Physics Letters, vol. 74 (No. 4), pp. 525–527, (1999).

Prioli, R., Reigada, D.C., and Freire, Jr., F.L., "Correlation between nano–scale friction and wear of boron carbide films deposited by dc–magnetron sputtering," Appl. Phys. Lett., vol. 75 (No. 9), pp. 1317–1319, (Aug. 30, 1999).

Hu, Ziaoming, von Blanckenhagen, P., "Generation and analysis of nano–scale A 1 islands by STM," Applied Physics A, S707–S710, (1998).

Sharma, P.K., Jilavi, M.H., Varadan, V.K., Schmidt, H. , "Influence of initial pH on the particle size and fluorescence properties of the nano scale Eu(III) doped yttria," Journal of Physics and Chemistry of Solids, pp. 171–177, (2001).

L.T. Canham, "Silicon quantum wire array fabrication by electrochemanical and chemical dissolution of wafers," Appl. Phys. Lett. 57, vol. 57 (No. 10), pp. 1046–1048, (Sep. 3, 1990).

Nobuyoshi Koshida and Hideki Koyama , "Visible electroluminescence from porous silicon," Appl. Phys. Lett., vol. 60 (No. 3), pp. 347–349, (Jan. 20, 1992).

(Continued)

*Primary Examiner*—Long Pham
*Assistant Examiner*—Wai-Sing Louie
(74) *Attorney, Agent, or Firm*—Salter & Michaelson

(57) ABSTRACT

This invention regards to novel light emitting device based on indirect bandgap materials. This device makes efficient electroluminescence possible in indirect-bandgap materials. With the quantum mechanically tunneling effect and carrier confinement, and/or small-scale roughness (in nano-meter range), and/or special (TO) phonon-assisted processes, the additional momentum required for radiative recombination of electrons and holes in indirect-bandgap materials could be provided to enhance luminescence at bandgap energy. Also, the tunneled carriers in the upper bands of large energy could directly transit to the bottom of bands by emitting photons at corresponding energy different from bandgap energy.

27 Claims, 12 Drawing Sheets

OTHER PUBLICATIONS

S. Lazarouk, P. Jaguiro, S. Katsouba, G. Masini, S. La Monica, G. Maiello, and A. Ferrari, "Stable electroluminescence from reverse biased n–type porous silicon–aluminum Schottky junction device.," Appl. Phys. Lett., vol. 68 (No. 15), pp. 2108–2110, (Apr. 8, 1996).

H. Ennen, J. Schneider, G. Pomrenke, and A. Axmann, "um luminescence of erbium–implanted III–V semiconductors and silicon.," Appl. Phys. Lett., vol. 43 (No. 10), pp. 943–945, (Nov. 15, 1983).

G. Franzo, F. Priolo, S. Coffa, A. Polman, A. Carnera, "Room–temperature electroluminescence from Er–doped crystalline Si," Appl. Phys. Lett., vol. 64 (No. 17), pp. 2235–2237, (Apr. 25, 1994).

Morito Matsuoka and Shun–Ichi Tohno, "Electroluminescence of erbium–doped silocon films as grown by ion beam epitaxy," Appl. Phys. Lett., vol. 71 (No. 1), pp. 96–98, (Jul. 7, 1997).

Liang–Sheng Liao, Xi–Mao Bao, Xiang–Qin Zheng, Ning–Sheng Li, and Nai Ben Min, "Blue luminescence from Si+–implanted SiO2 films thrmally grown on crystalline silicon," Appl. Phys. Lett., vol. 68 (No. 6), pp. 850–852, (Feb. 5, 1996).

W. Skorupa, R.A. Yankov, I. E. Tyschenko, H. Frob, T. Bohme, and K. Leo, "Room–temperature, short–wavelength (400–500 nm) photoluminescence from silicon–implanted silicon dioxide films.," Appl. Phys. Lett., vol. 68 (No. 17), pp. 2410–2412, (Apr. 22, 1996).

S. Oguz, William Paul, T.F. Deutsch, B–Y. Tsaur, and D. V. Murphy, "Synthesis of metastable, semiconducting Ge–Sn alloys by pulsed UV laser crystallization," Appl. Phys. Lett., vol. 43 (No. 9), pp. 848–850, (Nov. 1, 1983).

S. Schuppler, Sl.L. Friedman, M.A. Marcus, D.L. Adler, Y.–H. Xie, F. M. Ross, Y.J. Chabal, T.D. Harris, L.E. Brus, W.L. Brown, E.E. Chaban, P.F. Szajowski, S.B. Christman, and P.H. Citrin "Size, shape and composition of luminescent species in oxidized Sinanocrystals and H–passivated porous Si.," The American Physical Society, vol. 52 (vol. 7), pp. 4910–4925, (Aug. 15, 1995).

David B. Geohegan, Alex A. Puretzky, Gerd Duscher, and Stephen J. Pennycook, "Photoluminescence from gas–suspended SiOx nanoparticles synthesized by laser ablation," American Institute of Physics, vol. 73 (No. 4), pp. 438–440, (Jul. 27, 1998).

F. Buda, J. Kohanoff, and M. Parrinello, "Optical Properties of Porous Silicon: A First–Principles Study," The American Physical Society, vol. 69 (No. 8), pp. 1272–1275, (Aug. 24, 1992).

D. R. Baigent, R. N. Marks, N. C. Greenham, R. H. Friend, S. C. Moratti and A. B. Holmes, "Conjugated polymer light–emitting diodes on silicon substrates," Appl. Phys. Lett., vol. 65 (No. 21), p. 2636–2638, (Nov. 21, 1994).

A. J., Steckl and R. Birkhahn, "Visible emission from Er–doped GaN grown by solid source molecular beam epitaxy," American Institute of Physics, vol. 73 (No. 12), pp. 1700–1702, (Sep. 21, 1998).

M. Garter, J. Scofield, R. Birkhahn, and A.J. Steckl, "Visible and infrared rare–earth–activated electroluminescence from indium tin oxide Schottky diodes to GaN:Er on Si," American Institute of Physics, vol. 74 (No. 2), pp. 182–184, (Jan. 11, 1999).

Zhanghua Wu, Tomonobu, Nakayama, Shan Qiao, and Masakazu Aono., "Strong linear polarization in scanning tunneling microscopy–induced luminescence from porous silicon", American Institute of Physics, vol. 74 (No. 25), pp. 3842–3844, (Jun. 21, 1999).

C.W. Liu, J.C. Sturm, Y.R.J. Lacroix, M.L.W. Thewalt, and D. D. Perovic., "Growth and Photoluminescence of Strained <110> Si/Si1–xGex/Si Quantum Wells Grown By Rapid Thermal Chemical Vapor Deposition," Mat. Res. Soc. Symp. Proc., vol. 342, pp. 37–42, (1994).

A. St. Amour, C.W. Liu, J.C. Sturm, Y. Lacroix and M.L.W. Thewalt., "Defect–free band edge photoluminescence and band gap measurement of pseudomorphic Si1–x–yGexCy alloy layers on Si (100)," Appl. Phys. Lett., vol. 67 (No. 26), pp. 3915–3917, (Dec. 25, 1995).

C.W. Liu, J.C. Sturm, Y.R.J. Lacroix, M.L.W. Thewalt, and D.D. Perovic., "Growth and band gap of strained <110> Si1–xGex layers on silicon subtrates by chemical vapor deposition," Appl. Phys. Lett., vol. 65 (No. 1), pp. 76–78, (Jul. 4, 1994).

* cited by examiner

Si (a)

(b)

→ metal

Si (n type)

→ insulator

Si (intrinsic)

→ insulator

Si (p type)

→ metal

LIGHT EMITTING DEVICE BASED ON INDIRECT-BANDGAP MATERIALS

BACK OF THE INVENTION

Si is the most popular material for IC industry and the fabrication technology on Si wafers is very mature, so it is highly desired to use Si for applications in optoelectronics as well. However, Si is an indirect-bandgap material, so many efforts had been attempted to convert Si to a light-emitting material or generate light from Si wafers. Therefore, conversion of indirect-bandgap materials to light-emitting materials had been mostly focused on Si. As long as Si is proven to be able to emit light, other indirect-bandgap materials could be achieved similarly. Many efforts had been devoted to this challenging work before. Those efforts include porous-silicon-based devices,[1–3] doping impurity into Si,[4–6] Si+-implanted $SiO_2$,[7, 8] alloying Si with Ge or Sn,[9, 10] nanocrystalline Si,[11, 12] or quantum-confinement structures,[13] deposition of polymer on Si substrates,[14] growth of GaN on Si substrates,[15, 16] and so on. Porous Si mostly emits visible light. Its physics of luminescence had been attributed to surface states, surface species, and quantum confinement.[17] The exact mechanisms are still not well known. Doping impurities into Si utilizes luminescence centers like $Er^{3+}$ or other ions. The low solid solubility and small interaction cross section are serious hurdles for such applications. Alloying Si with Ge or Sn and nanocrystalline Si are based on the theory and engineering of band structures, trying to modify the indirect-bandgap nature of Si to direct bandgap. Its success very depends on the growth technology of epitaxial materials. The growth of GaN on Si substrates also relies on the growth technology of lattice-mismatched materials. Deposition of polymer on Si substrate is a simple way, but the polymer cannot endure high-temperature process and so possibly limits its compatibility with current IC technology. In the above approaches, either the Si material is significantly modified or other material is used for light emission, so the original conduction-band minimum and valence-band maximum of Si is not used for radiative recombination, leading to the light emission shifting away from the Si bandgap energy. Those modifications are mostly complicated or incompatible with current Si-based IC technology. In this invention, we use structures and concepts different from the above.

SUMMARY OF THE INVENTION

This invention is a breakthrough to the electrluminescence from indirect-bandgap materials. The light-emitting device of the invention makes the indirect-bandgap material able to emit light by electrical pumping.

According to the invention, the light-emitting device fabricated on indirect-bandgap material, comprises: Si (or other indirect bandgap semiconductors) substrate; a layer of thin insulator formed on the Si substrate; and a conductor deposited on the thin insulator, or multiple combination of above layers. In addition, nano-scale roughness may be fabricated in or on the indirect-bandgap material.

In the above light-emitting device, it is preferred to be selected from one of the following structures:

(1) A conductor-insulator-semiconductor structure (FIG. 1)

(2) A semiconductor-insulator-semiconductor structure (FIG. 9).

(3) Multiple conductor-insulator-semiconductor structures, e.g., conductor-insulator-semiconductor-insulator-semiconductor (FIG. 10), conductor-insulator-semiconductor-insulator-conductor (FIG. 11), etc.

(4) Multiple semiconductor-insulator-semiconductor structures, e.g., semiconductor-insulator-semiconductor-insulator-semiconductor (FIG. 12), etc.

(5) Nano-scale roughness fabricated in or on the indirect-bandgap materials.

(6) The combination of the above structures.

In the above light-emitting device, the layer of thin insulator is preferred in the range of 0.5 mm~10 nm so that quantum mechanically tunneling effect could happen.

In the above light-emitting device, the nano-scale roughness is preferred to be periodic or quasi-periodic.

In the above light-emitting device, the nano-scale roughness is preferred to have the lateral variation in the range of one lattice constant of the indirect-bandgap materials it is made on to 20 nm.

In the above light-emitting device, the layer of the thin insulator is preferred to be formed by one or more of the following methods:

(1) Oxidation of indirect bandgap material.

(2) Chemical vapor deposition.

(3) Liquid-phase deposition.

(4) Evaporation.

(5) Sputtering.

(6) Deposition of a layer of material that is different from the original indirect-bandgap material and then followed by oxidation of this layer.

In the above light-emitting device, the nano-scale roughness is preferred to be formed by oxidation of the surface, chemical etching, drying etching, nano-particle masking, proton bombardment, ion bombardment, e-beam lithography, ion-beam lithography, X-ray lithography, near-field lithography, micro-tip induced surface migration, and so on.

Figure 11:
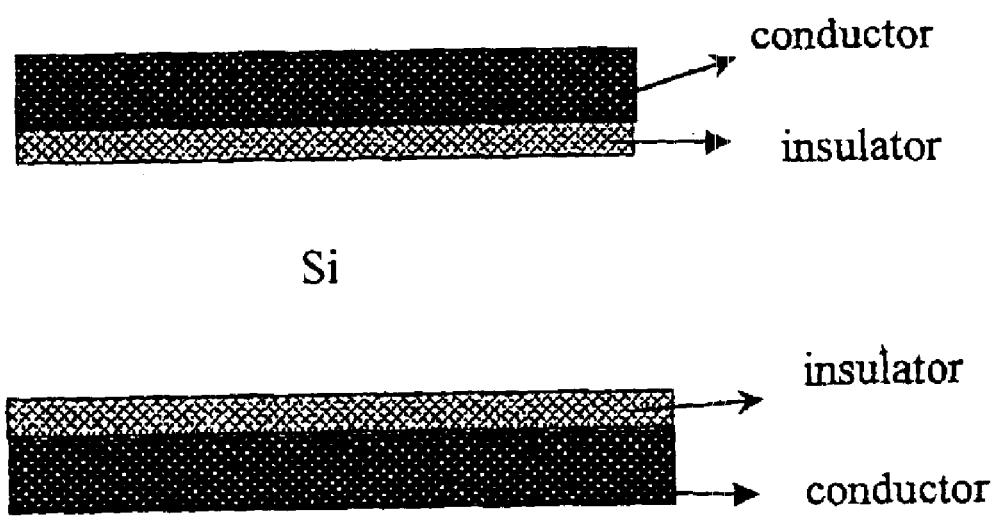

FIG. 11 is a third application example of the invention: multiple conductor-insulator-semiconductor structures—conductor-insulator-semiconductor-insulator-conductor for light generation from indirect-bandgap material (Si).

Figure 12:
Figure 12:
Figure 12:
Figure 12:

FIG. 12 is a fourth application example of the invention: multiple semiconductor-insulator-semiconductor structures, e.g., semiconductor-insulator-semiconductor-insulator-semiconductor for light generation from indirect-bandgap material (Si).

DETAILED EXPLANATION OF THE PREFERRED EMBODIMENT OF THE INVENTION

In this invention, we use different structures and concepts. In order to make the description easy to understand, we will use a simple structure for explanation, but the possibility is not limited to the structure. In the following, the metal-insulator-semiconductor (MIS) structure will be used for explanation.

Figure 1:
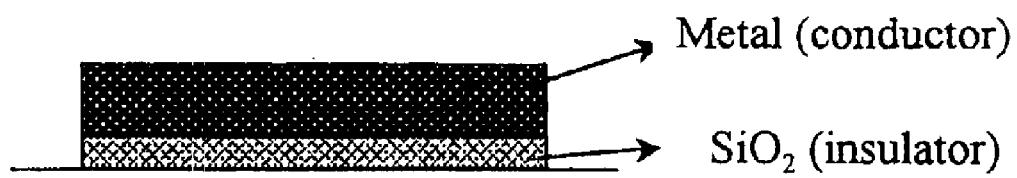
FIG. 1 is a conductor(metal)-insulator($SiO_2$)-semiconductor(Si) (MOS) structure for light generation from indirect-bandgap material (Si).
Figure 1:
Figure 2:
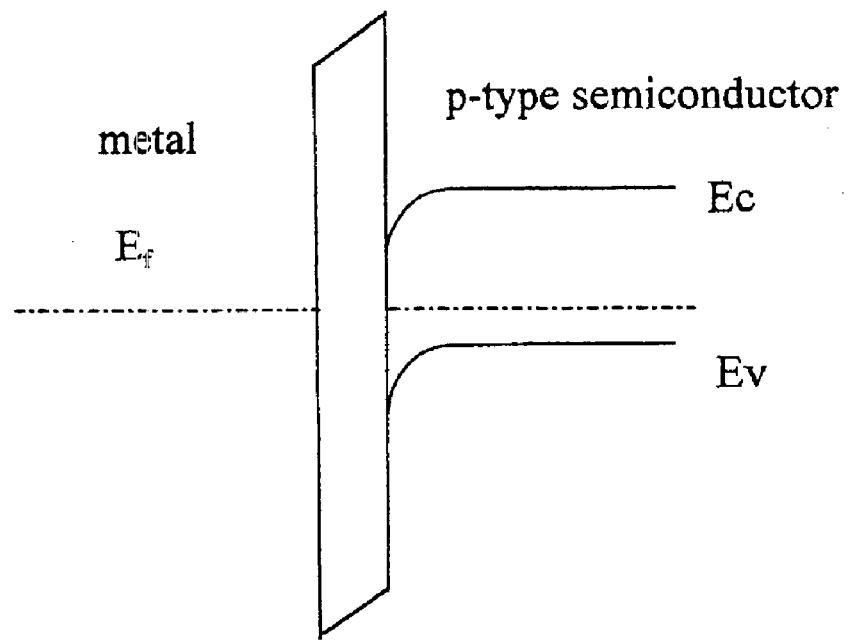
FIG. 2(a) is a schematic band diagram for the MOS on p-type Si under no bias.
FIG. 2(b) is a schematic band diagram for the MOS on p-type Si under forward bias.
Figure 2:
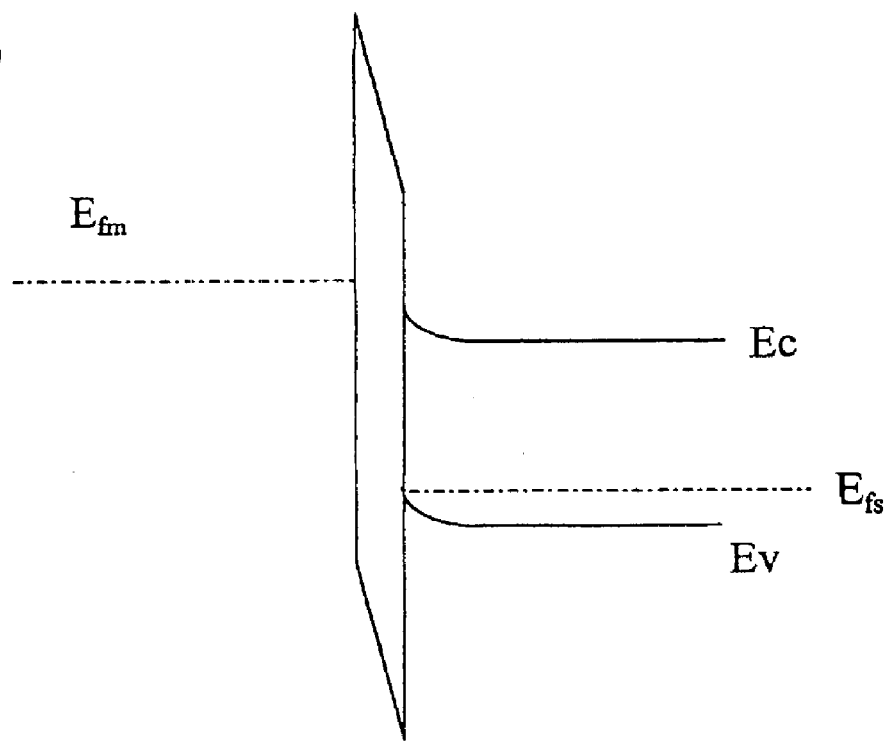

The MOS in this invention is similar to the conventional MOS in electronics. However, there is a significant difference. In conventional MOS for electronics, the oxide layer is for electrical insulation, so it has to be thick enough. For the MOS in this invention, the layer of oxide (or insulator) in this invention is very thin, so the quantum mechanically tunneling effect occurs. FIG. 1 shows a MOS structure. For the simplicity of description, the Si substrate is assumed to be p-type. A layer of thin oxide or insulator is grown or deposited on the p-type substrate. On top of the oxide (insulator) is the layer of conductor, which could be metal or transparent conductors. When there is no externally applied voltage, the energy band diagram is shown in FIG. 2(a). Due to the thermal equilibrium, the Fermi-energies in the Si and the conductor are at the same level, so the conduction and valence band are both bending. When the metal (conductor) is negatively biased, the bent bands gradually become flat. Further increase of the negative bias then causes the conduction and valence bands to bend to other direction, as shown in FIG. 2(b). Then the tunneled electrons from the conductor have energy larger than the conduction-band edge (Ec). Also, the potential in the oxide (insulator) is tilted, so the tunneling probability increases significantly according to quantum mechanics, leading to large tunneling current.

Figure 3:
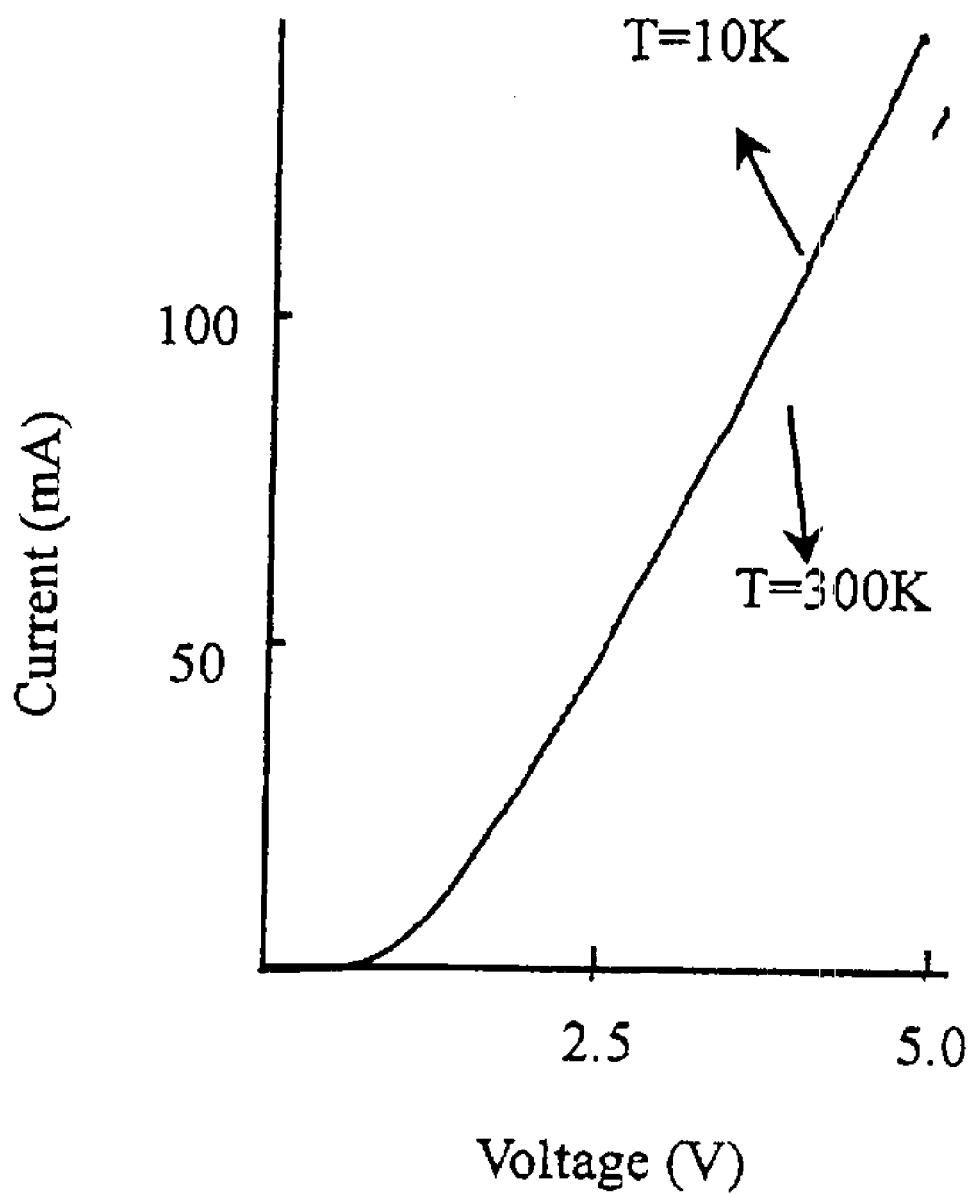
FIG. 3 shows the I(current)-V(voltage) characteristics of the MOS structure with extremely thin oxide (insulator).

The I-V characteristics of the MOS structure with extremely thin oxide (insulator) are shown in FIG. 3. The MOS structure then behaves like a tunneling diode. The I-V curve shows fair rectification characteristics. For the MOS on n-type Si, significant current could flow through the oxide when the metal is positively biased. On the other hand, significant current is measured when the metal on top of oxide is negatively biased for the MOS on p-type Si. Adapting the terminology of conventional diodes, we name this condition with large current flow as forward bias and the opposite bias as reversed bias. As shown in FIG. 2(b), for the MOS on p-type Si, $E_{fm}$ increases with the forward bias. Electrons then tunnel from metal to Si and holes tunnel vice versa. The major contribution of current comes from the tunneling of electrons instead of holes for the MOS on p-type Si. Increasing the negative bias at the metal side causes $E_{fm}$ to shift up to the conduction band edge (Ec). Then the tunneling current significantly increases because the tunneling electrons could fill in many states in the conduction band. On the other hand, the negative bias of metal causes the band of the p-type silicon to bend up near the $Si/SiO_2$ interface, as schematically shown in FIG. 2(b). A potential well for hole confinement is then formed, leading to the accumulation of holes near the interface. Consequently, huge population of the holes and the tunneling electrons simultaneously appear in the well region.

In addition to the simultaneous appearance of many electrons and holes in the same region, momentum conservation is also necessary to have radiative recombination. This could not, in general, happen in the indirect-bandgap materials. However, the thin layer of oxide (or insulator) provides the following characteristics so that the efficient electroluminescence becomes possible. For other structures that exhibit the following characteristics, efficient electroluminescence could also occur. It is not necessary to have all of the following characteristics. Only some of the following characteristics will be sufficient. Also, to make the descriptions easy to understand, they are based on MOS on p-type Si. For MOS on n-type Si, the roles of electrons and holes just need to be switched.

(1) The externally applied voltage causes the interface between the oxide (insulator) and Si to have a potential well, so many holes accumulate in this well. Also, many electrons tunnel to this region, so huge population of the holes and the tunneling electrons simultaneously appear in the well region.

Figure 4:
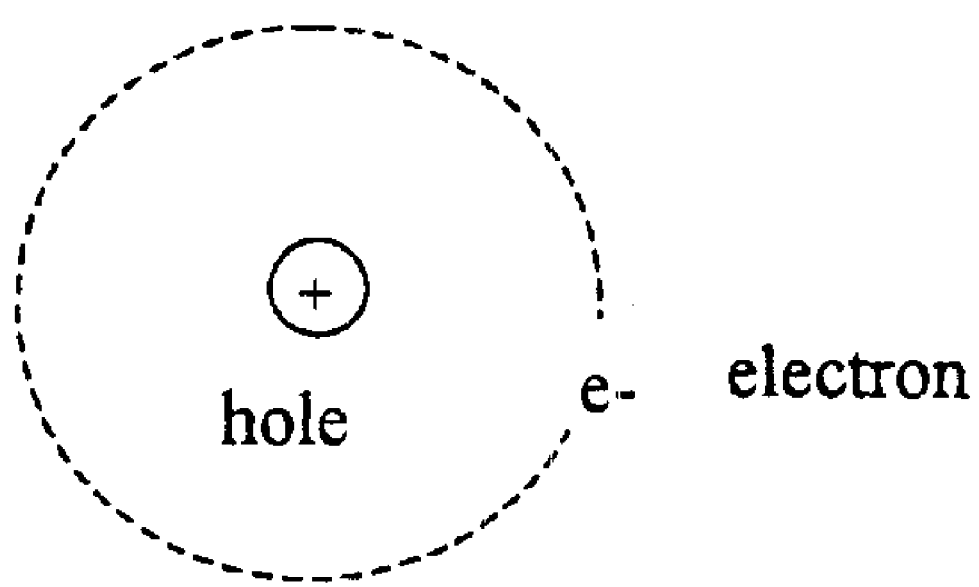
FIG. 4 is a schematic of exciton formed by an electrons and a hole.

(2) Due to the bend bending, the Fermi-level is above the and edge, so excitons could more easily exist. Without band-bending, the Fermi level is usually below the band edge and close to the exciton energy level, so the exciton could be easily dissembled to an electron and a hole. Because exciton is formed by an electron and a hole, they now already close to one another, as shown schematically in FIG. 4. Another particle, like phonon, could then join and increase the simultaneous collision of the three particles (electron, hole, and phonon).

(3) Formation of local roughness around the size of exciton (~10 nm) could also assist in the formation of exciton because an electrons and a hole could be spatially limited to the region. Then another particle, like phonon, could easily join to increase the probability of electron-hole radiative recombination.

(4) Electrons (or holes) injected into the semiconductors through tunneling, so their energy is above the conduction-band edge. When electrons relax to the conduction-band edge, they could emit more phonons. The increase of phonons causes the simultaneous collision of the three particles (electron, hole, and phonon) to more likely happen.

Figure 5:
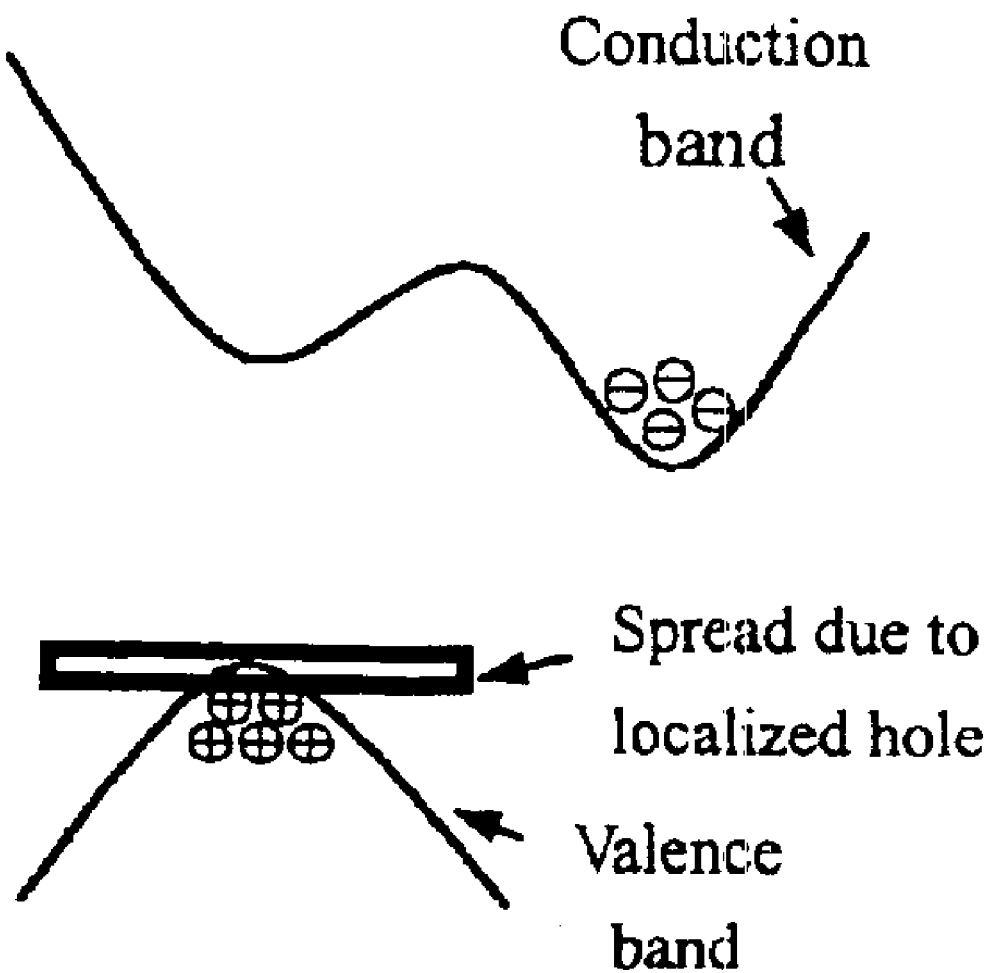
FIG. 5 is a schematic of the hole wavefunction in the momentum space being spread.

(5) The formation of potential well causes the wavefunction of holes to be localized in the space, so their wavefunction in the momentum space is more spread, as schematically shown in FIG. 5. Then the momentum conservation is more easily achieved because the momentum difference of electron and hole is reduced.

(6) The oxidation of the Si surface causes the formation of nano-scale roughness. Because the Si atoms on the top surface are very close, it is not possible to have each Si atom chemically bonded to oxygen. This nano-scale roughness then causes a perturbation to the wavefunction of electrons and holes. Their wavefunctions then could have components with the same momentum, so the electron-hole recombination has the momentum conservation.

Figure 6:
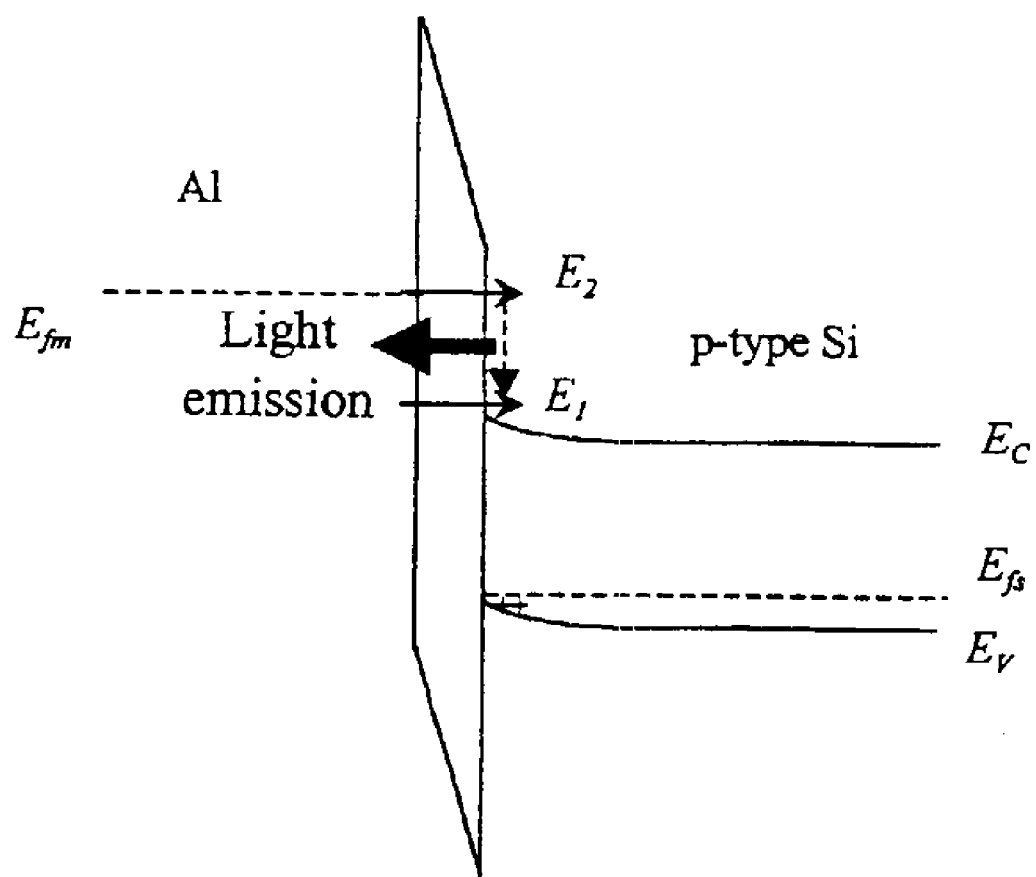
FIG. 6 shows that electrons in the upper bands could transit to the lower energy states by emitting photons with the corresponding energy.

(7) Electrons injected into the semiconductors through tunneling, so their energy is above the conduction-band edge. When they are in the upper bands, they could transit to the lower energy states by emitting photons with the corresponding energy as shown schematically in FIG. 6. Because the transition here is vertical, the momentum is conserved. In this case, the emitted light has the energy different from the band-gap energy.

Figure 7:
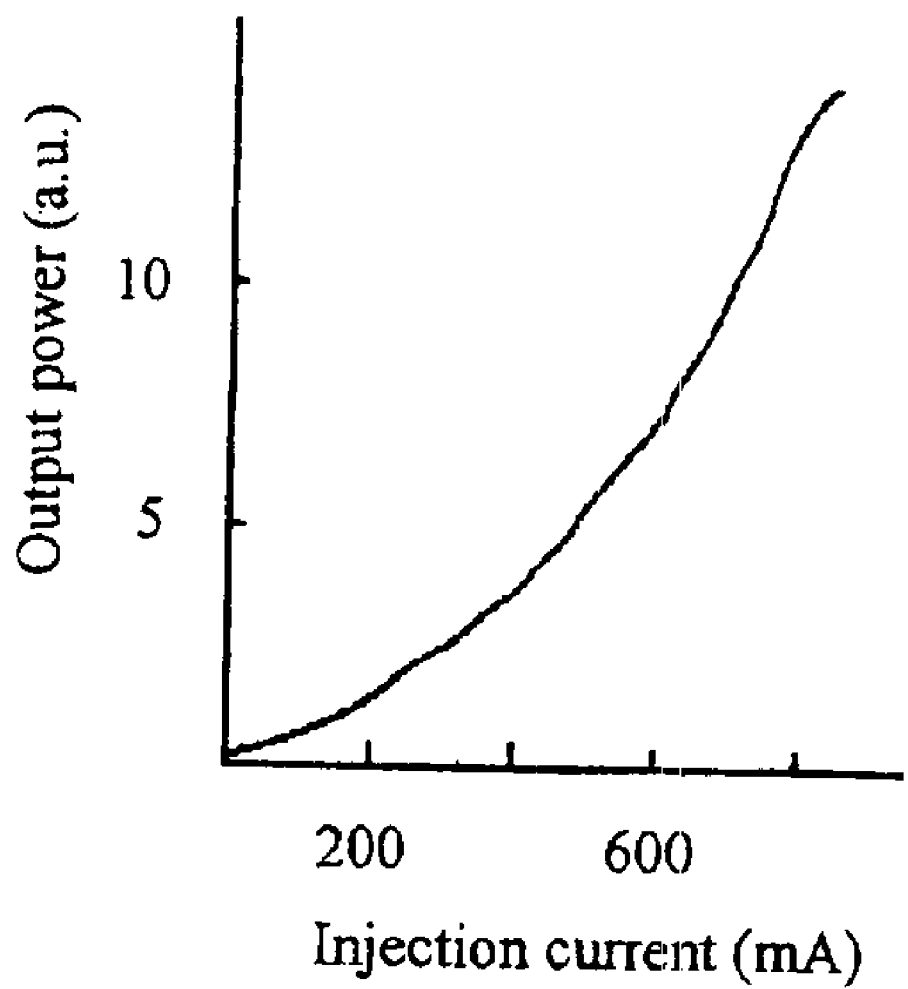
FIG. 7 shows the emitted output of light vs. injection current.
Figure 8:
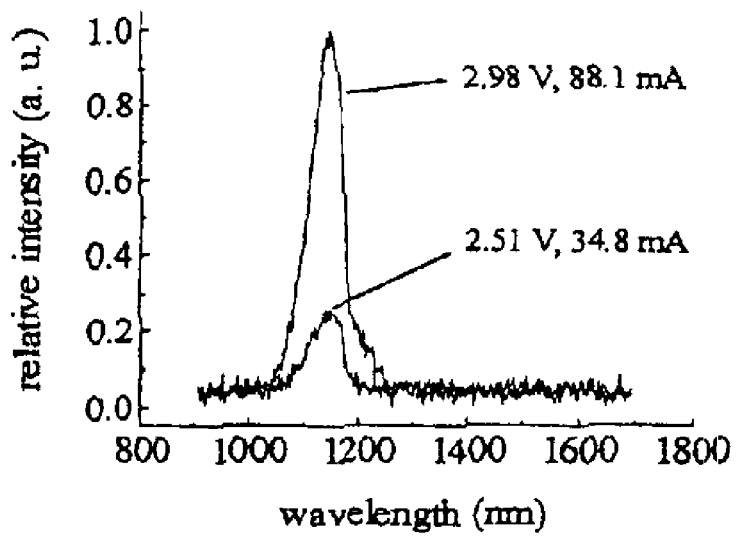
FIG. 8(a) and FIG. 8(b) show the measured spectrum for MOS on p-type silicon and MOS on n-type silicon, respectively.
Figure 8:
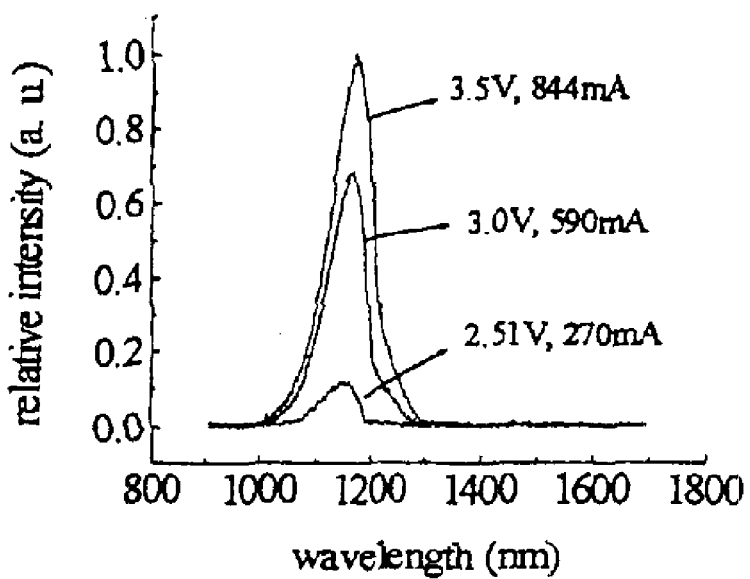

In practice, we had experimentally fabricated the MOS with very thin oxide. When the device is under forward bias, the electroluminescence could be clearly observed through the IR-viewer even with a current density as low as 0.67 A/cm$^2$. The emitted light super-linearly increases with the injected current, as shown in FIG. 7. The measured spectrum is shown in FIG. 8($a$) for MOS on p-type silicon, and FIG. 8($b$) for MOS on n-type silicon.

Although the above explanation is made only for the simple structure shown in FIG. 1, the following structures should work as well or even better.

Figure 9:
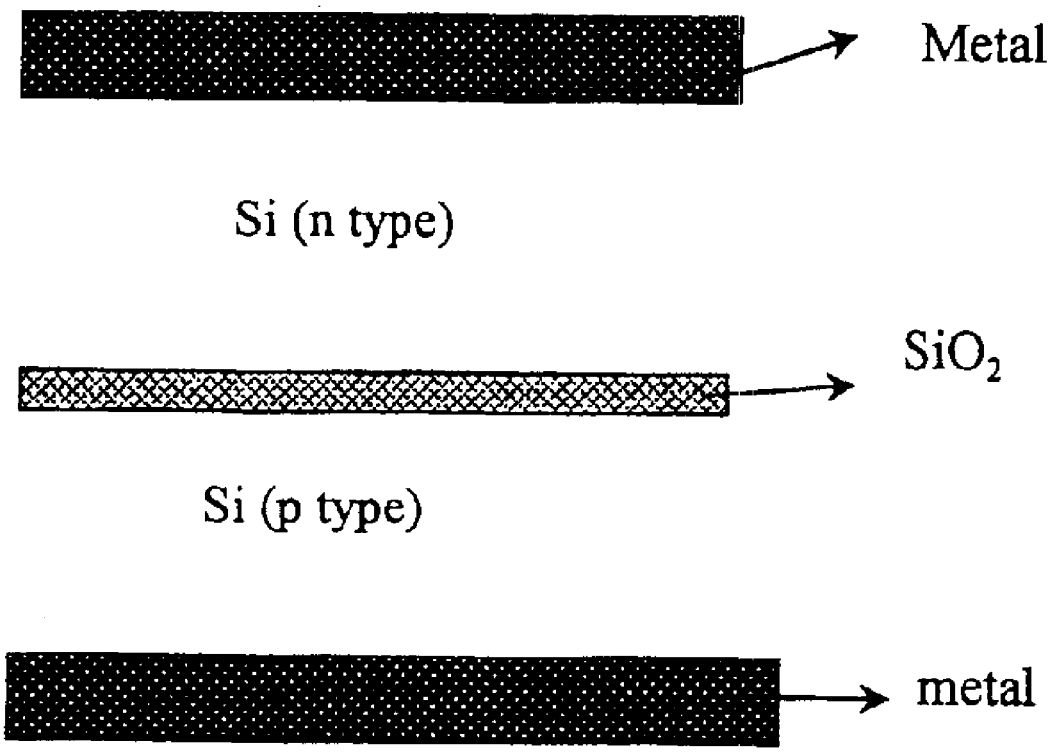
FIG. 9 is a first application example of the invention: semiconductor-insulator-semiconductor structure for light generation from indirect-bandgap material (Si).

(1) A semiconductor-insulator-semiconductor structure (FIG. 9).

Figure 10:
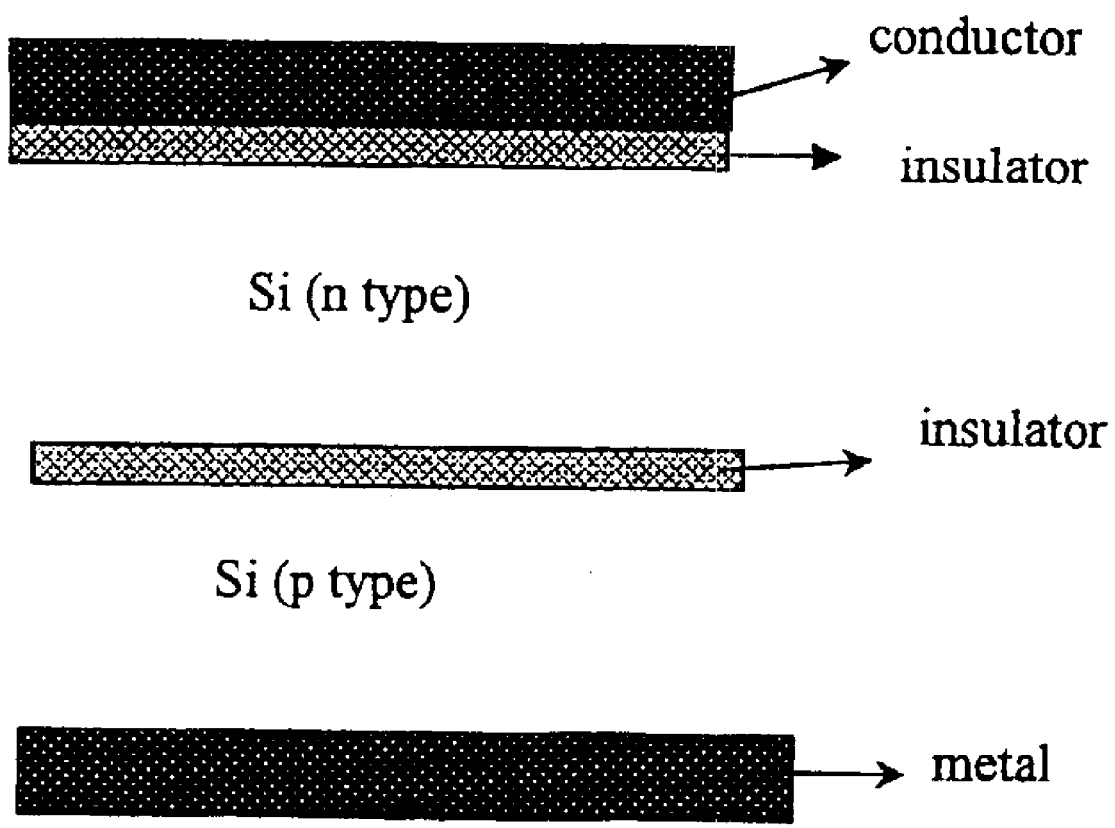
FIG. 10 is a second application example of the invention: multiple conductor-insulator-semiconductor structures— conductor-insulator-semiconductor-insulator-semiconductor for light generation from indirect-bandgap material (Si).

(2) Multiple conductor-insulator-semiconductor structures, e.g., conductor-insulator-semiconductor-insulator-semiconductor (FIG. 10), conductor-insulator-semiconductor-insulator-conductor (FIG. 11), etc.

(3) Multiple semiconductor-insulator-semiconductor structures, e.g., semiconductor-insulator-semiconductor-insulator-semiconductor (FIG. 12), etc.

(4) Nano-scale roughness fabricated in or on the indirect-bandgap materials.

(5) The combination of the above structures.

For the structure shown in FIG. 9, it is similar to the one shown in FIG. 1 except that the conductor layer is now replaced by the semiconductor. Then the band-bending effect should be similar and could enhance the electron-hole radiative recombination. For the structures shown in FIG. 10, FIG. 11, and FIG. 12, they are multiple stacking of the structures shown in FIG. 1 and FIG. 9. Similar band-bending effects should still occur as long as a proper biased voltage is applied. As a matter of fact, even more stacking of those layers should still work and might even be better because more potential wells are formed for the mechanisms mentioned above to happen. Because the basic principle is the same, so their detailed structures are not elaborated.

For the nano-scale roughness, if the scale is in the range of lattice constant to near 10 nm, it could cause a perturbation to the wavefunction of electrons and holes. Their wavefunctions then provide components with the same momentum to make the electron-hole recombination with the momentum conservation. If the scale of roughness is in the range of around 10 nm to 20 nm, it could help confine an electron and a hole in the same region to form exciton. Then phonon could easily join to enhance electron-hole radiative recombination.

The combination of the above structures will certainly work and probably increase the light emission from indirect-bandgap material because the several mechanisms previously mentioned coexist in the fabricated structure.

The present disclosure includes that contained in the appended claims as well as that of the foregoing description. Although this invention has been described in its preferred forms with a certain degree of particularity, it is understood that the present disclosure of the preferred form has been made only by way of example and numerous changes in the details of the construction and combination of arrangement of parts may be resorted to without departing from the spirit and scope of this invention.

REFERENCES

1. L. T. Canham, *Appl. Phys. Lett.* 57, pp. 1046–1048, 1990.
2. N. Koshida and H. Koyama, *Appl. Phys. Lett.* 60, pp. 347–349, 1992.
3. S. Lazarouk, P. Jaguiro, S. Katsouba, G. Masini, S. La Monica, G. Maiello, and F. Ferrari, *Appl. Phys. Lett.* 68, pp. 2108–2110, 1996.
4. H. Ennen, J. Schneider, G. Pomerenke, A. Axmann, *Appl. Phys. Lett.* 43, pp. 943–945, 1983.
5. G. Franzo, F. Priolo, S. Coffa, A. Polman, and A. Carnera, *Appl. Phys. Lett.* 64, pp. 2235–2237, 1994.
6. M. Matsuoka, and S. Tohno, *Appl. Phys. Lett.* 71, pp. 96–98, 1997.
7. L. S. Liao, X. -M. Bao, X. -Q. Zheng, N. -S. Li, and N. -B. Min, *Appl. Phys. Lett.* 68, pp. 850–852, 1996.
8. W. Skorupa, R. A. Yankov, I. E. Tyschenko, H. Frob, T. Bohme, and K. Leo, *Appl. Phys. Lett.* 68, pp. 2410–2412, 1996.
9. S. Oguz et al., *Appl. Phys. Lett.* 43, pp. 848–850, 1983.
10. C. W. Liu, J. C. Sturm, Y. R. J. Lacroix, M. L. W. Thewalt, and D. D. Ferovic, *Mat. Res. Soc. Symp. Proc.* 342, pp. 37–42, 1994.
11. S. Schuppler, S. L. Friedman, M. A. Marcus, D. L. Adler, Y. -H. Xie, F. M. Ross, Y. J. Chabal, T. D. Harris, L. E. Brus, W. L. Brown, E. E. Chaban, P. F. Szajowski, S. B. Christman, and P. H. Citrin, *Phys. Rev.* B 52, pp. 4910–4925, 1995.
12. D. B. Geohegan, A. A. Puretzky, G. Duscher, and S. J. Pennycook, *Appl. Phys. Lett.* 73, pp. 438–439, 1998.
13. F. Buda et al., *Phys. Rev. Lett.* 69, pp. 1272–1275, 1992.
14. D. R. Baigent, R. N. Marks, N. C. Greenham, R. H. Friend, S. C. Moratti, and A. B. Holmes, *Appl. Phys. Lett.* 65, pp. 2636–2638, 1994.
15. R. Birkhahn and A. J. Steckl, *Appl. Phys. Lett.* 73, pp. 1700–1702, 1998.
16. M. Garter, J. Scofield, R. Birkhahn, and A. J. Steckl, *Appl. Phys. Lett.* 74, pp. 182–184, 1999.
17. Zhanghua Wu, Tomonobu Nakayama, Shan Qiao, and Masakazu Aono, *Appl. Phys. Lett.* 74, pp. 3842–3844, 1999.

What is claimed is:

1. A light-emitting device fabricated on indirect-bandgap material, comprising:

an indirect bandgap material substrate having a surface;

a layer of thin insulator overlaying and in direct contact with the surface of the indirect bandgap material substrate; and a conductor overlaying and in direct contact with the thin insulator, wherein the surface of the indirect-bandgap material substrate in contact with the thin insulator has a nano-scale roughness, and wherein, upon application of a voltage, light in the range of about 1100 nm is emitted from the substrate.

2. The light-emitting device of claim 1, wherein the light-emitting device is a multiple-layer structure formed by laminating the substrate, the conductor, and the insulator between the substrate and the conductor.

3. The light-emitting device of claim 1, wherein the layer of the insulator is in the range of 0.5 nm–10 nm so that quantum mechanically tunneling effect could happen.

4. The light-emitting device of claim 1, wherein the nano-scale roughness is periodic, quasi-periodic, or non-periodic.

5. The light-emitting device of claim 1, wherein the nano-scale roughness has the lateral variation in the range of one lattice constant of the indirect-bandgap materials it is made on to 20 nm.

6. The light-emitting device of claim 1, wherein the layer of the thin insulator is a layer selected from the group consisting of a thermal oxide layer, a chemical vapor deposition layer, a liquid-phase deposition layer, an evaporated layer, a sputtered layer, an oxide of a layer of material that is different from the substrate.

7. The light-emitting device of claim 1, wherein the nano-scale roughness is the result of oxidation of the surface, chemical etching, drying etching, nano-particle masking, proton bombardment, ion bombardment, e-beam lithography, ion-beam lithography, X-ray lithography, near-field lithography, and micro-tip induced surface migration.

8. A light-emitting device, comprising:

an indirect-bandgap substrate having a surface;

an insulating layer overlaying the surface of the substrate; and a conductive layer overlaying and in direct contact with the insulating layer;

wherein the surface of the substrate includes a nano-scale roughness, and wherein light is emitted from the substrate in the range of about 1100 nm upon application of an external voltage to the device.

9. The device of claim 8, wherein the nano-scale roughness is fabricated in or on the indirect-bandgap material.

10. The device of claim 8, wherein the light-emitting device is selected from at least one of the group consisting of a conductor-insulator-semiconductor structure, a semiconductor-insulator-semiconductor structure, a multiple conductor-insulator-semiconductor structure, a multiple semiconductor-insulator-semiconductor structures, and combinations thereof.

11. The device of claim 8, wherein the insulating layer has a thickness ranging from about 0.5 nm to about 10 nm.

12. The device of claim 8, wherein the nano-scale roughness is periodic.

13. The device of claim 8, wherein the nano-scale roughness is quasi-periodic.

14. The device of claim 8, wherein the nano-scale roughness is non-periodic.

15. The device of claim 8, wherein the lateral variation in the nano-scale roughness ranges from about one lattice constant of the indirect-bandgap substrate to about 20 nm.

16. The device of claim 8, further comprising a layer of a second indirect-bandgap material different than the substrate is disposed between the substrate surface and the insulating layer.

17. The device of claim 8, wherein the indirect-bandgap substrate is silicon.

18. A light-emitting device, comprising:

an indirect-bandgap substrate having a surface;

an insulating layer overlaying the surface of the substrate; and a conductive layer overlaying and in direct contact with the insulating layer;

wherein the insulating layer has a thickness ranging from about 0.5 nm to about 10 nm, and wherein light is emitted from the substrate in the range of about 1100 nm upon application of an external voltage to the device.

19. The light-emitting device of claim 18, wherein the layer of thin insulator further comprises a nano-scale roughness to assist localization of carriers, wherein the scale of such roughness is in the range of 0.5 nm to 50 nm.

20. The light-emitting device of claim 8, wherein nano-scale roughness is formed in the layer of thin insulator using one of the processes selected from the group consisting of oxidation of the semiconductor surface, deposition/formation of the insulator layer, deposition of nano-particles, chemical etching, drying etching, nano-particle masking, proton bombardment, ion bombardment, e-beam lithography, ion-beam lithography, x-ray lithography, near-field lithography, micro/nano-tip induced surface migration, and laser ablation.

21. The light emitting device of claim 18, wherein the light is emitted from the substrate in the range of about 1100 nm.

22. The light-emitting device of claim 18, wherein the substrate has a surface, and the surface has a nano-scale roughness.

23. The light-emitting device of claim 21, wherein the roughness is periodic, quasi-periodic, or non-periodic.

24. The light-emitting device of claim 18, wherein the nano-scale roughness has a lateral variation ranging from about one lattice constant of substrate material up to about 20 nm.

25. The light-emitting device of claim 18, wherein the layer of the thin insulator is a layer selected from the group consisting of a thermal oxide layer, a chemical vapor deposition layer, a liquid-phase deposition layer, an evaporated layer, a sputtered layer, an oxide of a layer of material that is different from the substrate.

26. The light-emitting device of claim 1 wherein the light is emitted in a region proximate the interface of the indirect-bandgap material and the insulating layer.

27. The light-emitting device of claim 1, wherein the substrate is silicon.

* * * * *